| (12) | United States Patent | (10) Patent No.: | US 10,809,283 B2 |
|---|---|---|---|
| | Saitoh | (45) Date of Patent: | Oct. 20, 2020 |

(54) CIRCUIT BOARD

(71) Applicant: TOYOTA JIDOSHA KABUSHIKI KAISHA, Toyota-shi, Aichi (JP)

(72) Inventor: Manabu Saitoh, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 2 days.

(21) Appl. No.: 16/299,558

(22) Filed: Mar. 12, 2019

(65) Prior Publication Data

US 2019/0317137 A1 Oct. 17, 2019

(30) Foreign Application Priority Data

Apr. 16, 2018 (JP) .................................. 2018-078614

(51) Int. Cl.
| | |
|---|---|
| *G01R 19/18* | (2006.01) |
| *G01R 19/00* | (2006.01) |
| *H02M 3/158* | (2006.01) |
| *H01C 7/10* | (2006.01) |
| *H03F 3/45* | (2006.01) |
| *H05K 1/18* | (2006.01) |
| *H05K 1/16* | (2006.01) |
| *H02M 7/48* | (2007.01) |

(52) U.S. Cl.
CPC ........... *G01R 19/0023* (2013.01); *H01C 7/10* (2013.01); *H02M 3/1582* (2013.01); *H02M 7/48* (2013.01); *H03F 3/45* (2013.01); *H05K 1/167* (2013.01); *H05K 1/181* (2013.01)

(58) Field of Classification Search
CPC .. G01R 19/0023; G01R 19/165; G01R 19/25; G01R 19/16538; G01R 19/2509; G01R 15/18; G01R 15/183
See application file for complete search history.

(56) References Cited

U.S. PATENT DOCUMENTS

| 7,394,421 | B2 * | 7/2008 | Morisson | ............ | H03M 1/0682 |
| | | | | | 341/154 |
| 8,760,168 | B2 * | 6/2014 | Kudo | .................... | B60L 3/0038 |
| | | | | | 324/426 |
| 9,807,873 | B2 * | 10/2017 | Matsumoto | .......... | H05K 1/0268 |
| 2010/0085232 | A1 * | 4/2010 | Nicolas | ................. | H03M 1/362 |
| | | | | | 341/159 |
| 2012/0286717 | A1 | 11/2012 | Fukuta et al. | | |

FOREIGN PATENT DOCUMENTS

JP 2012-239251 A 12/2012

* cited by examiner

*Primary Examiner* — Thang X Le (74) *Attorney, Agent, or Firm* — Oliff PLC (57) ABSTRACT

A circuit board which includes a circuit that measures an input voltage and an output voltage in a voltage converter that converts the input voltage which is a difference between first and second voltages into the output voltage which is a difference between third and second voltages, may include: first to fourth resistor circuits respectively including first to fourth resistor element groups; a first differential amplifier circuit configured such that the first voltage is inputted via the first resistor element group and the second voltage is inputted via the second resistor element group; and a second differential amplifier circuit configured such that the third voltage is inputted via the third resistor element group and the second voltage is inputted via the fourth resistor element group. The second and fourth resistor element groups may be arranged to be adjacent to each other between the first and third resistor element groups.

3 Claims, 7 Drawing Sheets

CIRCUIT BOARD

CROSS-REFERENCE TO RELATED APPLICATION

This application claims priority to Japanese Patent Application No. 2018-078614 filed on Apr. 16, 2018, the contents of which are hereby incorporated by reference into the present application.

TECHNICAL FIELD

A technique disclosed herein relates to a circuit board comprising a circuit configured to measure both of an input voltage and an output voltage in a voltage converter.

BACKGROUND

Japanese Patent Application Publication No. 2012-239251 describes a circuit board including a circuit configured to measure both of an input voltage and an output voltage in a voltage converter included in a power converter. A control circuit boarded in this circuit board is configured to generate a control signal for controlling the power converter based on both of the input voltage and the output voltage in the voltage converter.

The control circuit boarded in the circuit board includes an A/D conversion circuit, and is configured to obtain digital values respectively corresponding to the input voltage and the output voltage in the voltage converter. Each of the input voltage and the output voltage in the voltage converter is a high voltage. Therefore, to be inputted to the control circuit, each of the input voltage and the output voltage in the voltage converter needs to be stepped down to a voltage that can be inputted to the A/D conversion circuit. The circuit board in Japanese Patent Application Publication No. 2012-239251 includes a resistor circuit that steps down each of the input voltage and the output voltage in the voltage converter, in a stage preceding the A/D conversion circuit in the control circuit.

Such a resistor circuit includes a resistor element group including a plurality of resistor elements. Thus, a technique for boarding such a resistor element group in a circuit board with a small footprint is being required.

SUMMARY

The disclosure herein discloses a circuit board comprising a circuit configured to measure both of an input voltage and an output voltage in a voltage converter that is configured to convert the input voltage which is a difference between a first voltage and a second voltage into the output voltage which is a difference between a third voltage and the second voltage. This circuit board may comprise: a first resistor circuit comprising a first resistor element group; a second resistor circuit comprising a second resistor element group: a third resistor circuit comprising a third resistor element group; a fourth resistor circuit comprising a fourth resistor element group; a first differential amplifier circuit comprising a pair of input terminals, and configured such that the first voltage is inputted to one of the pair of input terminals via the first resistor element group of the first resistor circuit and the second voltage is inputted to other one of the pair of input terminals via the second resistor element group of the second resistor circuit; a second differential amplifier circuit comprising a pair of input terminals, and configured such that the third voltage is inputted to one of the pair of input terminals via the third resistor element group of the third resistor circuit and the second voltage is inputted to other one of the pair of input terminals via the fourth resistor element group of the fourth resistor circuit; and a control circuit comprising an A/D conversion circuit configured to execute A/D conversion for each of an output from the first differential amplifier circuit and an output from the second differential amplifier circuit. The second resistor element group and the fourth resistor element group may be arranged to be adjacent to each other between the first resistor element group and the third resistor element group.

In the above circuit board, the second voltage is inputted to both of the second resistor element group of the second resistor circuit and the fourth resistor element group of the fourth resistor circuit, that is, the same voltage is inputted to both of them. Due to this, there is no need to secure a creeping distance between the second resistor element group and the fourth resistor element group. Since the second resistor element group and the fourth resistor element group can thereby be arranged to be adjacent to each other on the circuit board, they can be boarded in the circuit board with a small footprint.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved circuit boards, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 1:
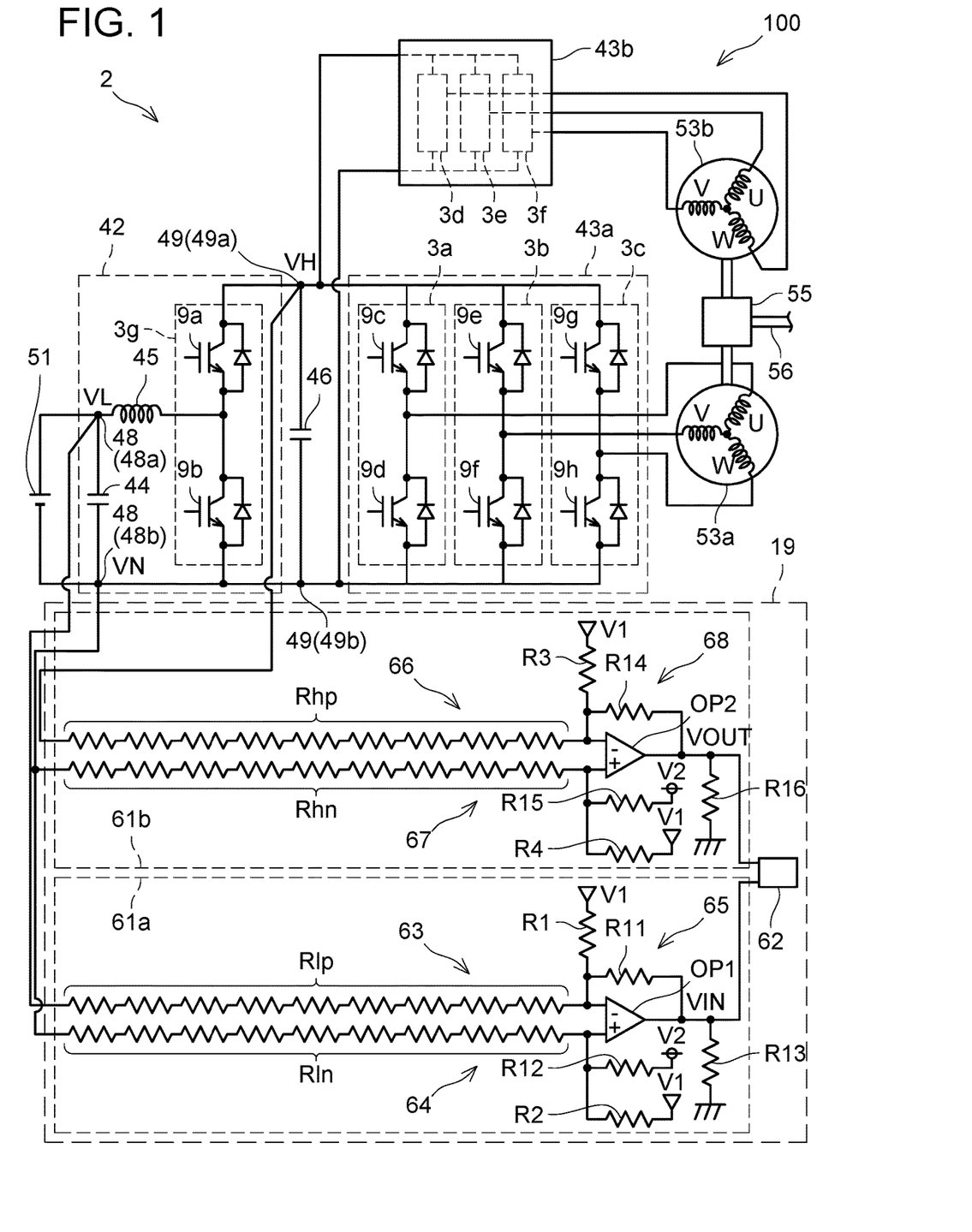
FIG. 1 is a block diagram of a power system of an electric vehicle including a power converter.

FIG. 1 shows a block diagram of a power system of an electric vehicle 100 including a power converter 2. The power converter 2 is a device for converting battery power to driving power for an electric traction motor. The electric vehicle 100 includes two electric traction motors 53a, 53b. Due to this, the power converter 2 includes two sets of inverter circuits 43a, 43b. Outputs from the two motors 53a, 53b are combined by a gear set 55 and is transmitted to an axle 56 (that is, driving wheels).

The power converter 2 is connected to a battery 51. The power converter 2 includes a voltage converter circuit 42 that boosts a voltage of the battery 51, and the two sets of inverter circuits 43a, 43b each for converting the boosted DC (direct current) power to AC (alternating current) power.

The voltage converter circuit 42 is a bidirectional DC-DC converter capable of executing both a boosting operation and a step-down operation. In the boosting operation, a voltage applied to a battery-side terminal is boosted and outputted to an inverter circuit-side terminal. In the step-down operation, a voltage applied to the inverter circuit-side terminal is stepped down and outputted to the battery-side terminal. Hereinbelow, for the convenience of explanation, the battery-side (low voltage-side) terminal will be termed an input terminal 48, and the inverter circuit-side (high voltage-side) terminal will be termed an output terminal 49. A positive side and a negative side of the input terminal 48 will respectively be termed an input positive terminal 48a and an input negative terminal 48b. A positive side and a negative side of the output terminal 49 will respectively be termed an output positive terminal 49a and an output negative terminal 49b. A voltage on the input positive terminal 48a is an input positive voltage VL, a voltage on the output positive terminal 49a is an output positive voltage VH, and a voltage on the input negative terminal 48b and the output negative terminal 49b is a negative voltage VN. The terminologies "input terminal 48" and "output terminal 49" are used to simplify the explanation, and since the voltage converter circuit 42 is a bidirectional DC-DC converter, as aforementioned, there also is a case where power flows from the output terminal 49 to the input terminal 48.

The voltage converter circuit 42 includes a series circuit of two switching elements 9a, 9b, a filter capacitor 44, a reactor 45, and diodes connected inverse-parallel to the respective switching elements. The reactor 45 has its one end connected to the input positive terminal 48a and the other end thereof connected to a midpoint of the series circuit. The filter capacitor 44 is connected between the input positive terminal 48a and the input negative terminal 48b. The input negative terminal 48b is connected directly to the output negative terminal 49b. The switching element 9b primarily carries out the boosting operation, and the switching element 9a primarily carries out the step-down operation. The circuit in a broken-line rectangle indicated with a reference sign 3g corresponds to a semiconductor module 3g to be described later. The voltage converter circuit 42 of FIG. 1 is called a chopper converter. Since the voltage converter circuit 42 of FIG. 1 is well known, detailed descriptions thereof will be omitted.

The inverter circuit 43a includes a configuration in which three sets of series circuits, each of which includes two switching elements, are connected in parallel. Switching elements 9c and 9d, switching elements 9e and 9f, and switching elements 9g and 9h respectively configure the series circuits. Each of the switching elements has a diode connected in inverse parallel. A high potential side of the three sets of series circuits is connected to the output positive terminal 49a of the voltage converter circuit 42, and a low potential side of the three sets of series circuits is connected to the output negative terminal 49b of the voltage converter circuit 42. Alternating currents (U phase, V phase, W phase) are outputted from respective midpoints of the three sets of series circuits. Each of the three sets of series circuits corresponds to one of semiconductor modules 3a, 3b, 3c to be described later.

Since a configuration of the inverter circuit 43b is identical to that of the inverter circuit 43a, its specific depiction of circuits is omitted in FIG. 1. Similarly to the inverter circuit 43a, the inverter circuit 43b includes a configuration in which three sets of series circuits, each of which includes two switching elements, are connected in parallel. A high potential side of the three sets of series circuits is connected to the output positive terminal 49a of the voltage converter circuit 42, and a low potential side of the three sets of series circuits is connected to the output negative terminal 49b of the voltage converter circuit 42. Alternating current is outputted from respective midpoints of the three sets of series circuits. Hardware configurations corresponding to the respective series circuits are termed semiconductor modules 3d, 3e, 3f.

A smoothing capacitor 46 is connected in parallel to input terminals of the inverter circuits 43a, 43b. The smoothing capacitor 46 is, in other words, connected in parallel to the output terminal 49 of the voltage converter circuit 42. The smoothing capacitor 46 removes ripples from an output current of the voltage converter circuit 42.

The switching elements 9a to 9h are transistors for power conversion, and are typically Insulated Gate Bipolar Transistors (IGBTs). The switching elements 9a to 9h may be other transistors such as Metal Oxide Semiconductor Field Effect Transistors (MOSFETs). The power converting transistors may be called power semiconductor elements.

The power converter 2 further includes a circuit board 19 that has various circuits for controlling the switching elements 9a to 9h boarded therein. This circuit board 19 includes an input voltage adjustment circuit 61a and an output voltage adjustment circuit 61b. The input voltage adjustment circuit 61a generates an adjusted input voltage VIN, which is obtained by stepping down an input voltage (VL−VN) that is a difference between the input positive voltage VL and the negative voltage VN. The output voltage adjustment circuit 61b generates an adjusted output voltage VOUT, which is obtained by stepping down an output voltage (VH−VN) that is a difference between the output positive voltage VH and the negative voltage VN. The adjusted input voltage VIN and the adjusted output voltage VOUT are inputted to a control circuit 62. The control circuit 62 includes an A/D conversion circuit that converts the adjusted input voltage VIN and the adjusted output voltage VOUT respectively into digital values. Based on these digital values and an output target command from a higher-level controller (not shown), the control circuit 62 decides on duty ratios for the respective switching elements 9a to 9h. The control circuit 62 transmits PWM signals having the decided duty ratios to drive circuits that respectively drive the switching elements 9a to 9h. The drive circuits of the respective switching elements 9a to 9h are also boarded in the circuit board 19.

The input voltage adjustment circuit 61a is a circuit that steps down the input voltage (VL−VN) such that the adjusted input voltage VIN is a voltage that can be inputted to the A/D conversion circuit. The input voltage adjustment circuit 61a includes a first resistor circuit 63, a second resistor circuit 64, and a first differential amplifier circuit 65. The first resistor circuit 63 and the second resistor circuit 64 are configured to step down the input voltage (VL−VN) and output it to the first differential amplifier circuit 65. A voltage generated by stepping down the input positive voltage VL by the first resistor circuit 63 is inputted to an inverting input terminal of an operational amplifier OP1 of the first differential amplifier circuit 65. A voltage generated by stepping down the negative voltage VN by the second resistor circuit 64 is inputted to a non-inverting input terminal of the operational amplifier OP1 of the first differential amplifier circuit 65.

The first resistor circuit 63 includes a first resistor element group Rlp and a first resistor element R1. The first resistor element group Rlp has its one end connected to the input positive terminal 48a and has the other end thereof connected to one end of the first resistor element R1. The first resistor element R1 has the other end thereof connected to a reference terminal. A voltage V1 is applied to the reference terminal for adjustment of a common-mode input voltage range of the operational amplifier OP1. A midpoint between the first resistor element group Rlp and the first resistor element R1 is connected to the inverting input terminal of the operational amplifier OP1.

The second resistor circuit 64 includes a second resistor element group Rln and a second resistor element R2. The second resistor element group Rln has its one end connected to the input negative terminal 48b and has the other end thereof connected to one end of the second resistor element R2. The second resistor element R2 has the other end thereof connected to the reference terminal. The voltage V1 is applied to the reference terminal for adjustment of the common-mode input voltage range of the operational amplifier OP1. A midpoint between the second resistor element group Rln and the second resistor element R2 is connected to the non-inverting input terminal of the operational amplifier OP1. Each of the first resistor element group Rlp and the second resistor element group Rln is constituted of a plurality of resistor elements, so an insulating property between the resistor elements can be ensured.

A resistor element R11 is connected between an output terminal of the operational amplifier OP1 and the inverting input terminal thereof, by which an amplification factor of the first differential amplifier circuit 65 is adjusted. Further, a voltage V2 is applied to the non-inverting input terminal of the operational amplifier OP1 via a resistor element R12, and a ground voltage is applied to the output terminal of the operational amplifier OP1 via a resistor R13. The input voltage adjustment circuit 61a can thereby step down the input voltage (VL−VN), which is a difference between the input positive voltage VL and the negative voltage VN, to a voltage that can be inputted to the A/D conversion circuit of the control circuit 62 by utilizing the resistor circuits 63, 64 and the first differential amplifier circuit 65, and output the stepped-down voltage, namely, the adjusted input voltage VIN to the A/D conversion circuit of the control circuit 62.

The output voltage adjustment circuit 61b is a circuit that steps down the output voltage (VH−VN) such that the adjusted output voltage VOUT is a voltage that can be inputted to the A/D conversion circuit. The output voltage adjustment circuit 61b includes a third resistor circuit 66, a fourth resistor circuit 67, and a second differential amplifier circuit 68. The third resistor circuit 66 and the fourth resistor circuit 67 are configured to step down the output voltage (VH−VN) and output it to the second differential amplifier circuit 68. A voltage generated by stepping down the output positive voltage VH by the third resistor circuit 66 is inputted to an inverting input terminal of an operational amplifier OP2 of the second differential amplifier circuit 68. A voltage generated by stepping down the negative voltage VN by the fourth resistor circuit 67 is inputted to a non-inverting input terminal of the operational amplifier OP2 of the second differential amplifier circuit 68.

The third resistor circuit 66 includes a third resistor element group Rhp and a third resistor element R3. The third resistor element group Rhp has its one end connected to the output positive terminal 49a and has the other end thereof connected to one end of the third resistor element R3. The third resistor element R3 has the other end thereof connected to the reference terminal. The voltage V1 is applied to the reference terminal for adjustment of a common-mode input voltage range of the operational amplifier OP2. A midpoint between the third resistor element group Rhp and the third resistor element R3 is connected to the inverting input terminal of the operational amplifier OP2.

The fourth resistor circuit 67 includes a fourth resistor element group Rhn and a fourth resistor element R4. The fourth resistor element group Rhn has its one end connected to the input negative terminal 48b (that is, the output negative terminal 49b) and has the other end thereof connected to one end of the fourth resistor element R4. The fourth resistor element R4 has the other end thereof connected to the reference terminal. The voltage V1 is applied to the reference terminal for adjustment of the common-mode input voltage range of the operational amplifier OP2. A midpoint between the fourth resistor element group Rhn and the fourth resistor element R4 is connected to the non-inverting input terminal of the operational amplifier OP2. Each of the third resistor element group Rhp and the fourth resistor element group Rhn is constituted of the plurality of resistor elements, so an insulating property between the resistor elements can be ensured.

A resistor element R14 is connected between an output terminal of the operational amplifier OP2 and the inverting input terminal thereof, by which an amplification factor of the second differential amplifier circuit 68 is adjusted. Further, the voltage V2 is applied to the non-inverting input terminal of the operational amplifier OP2 via a resistor element R15, and the ground voltage is applied to the output terminal of the operational amplifier OP2 via a resistor R16. The output voltage adjustment circuit 61b can thereby step down the output voltage (VH−VN), which is a difference between the output positive voltage VH and the negative voltage VN, to a voltage that can be inputted to the A/D conversion circuit of the control circuit 62 by utilizing the resistor circuits 66, 67 and the second differential amplifier circuit 68, and output the stepped-down voltage, namely, the adjusted output voltage VOUT to the A/D conversion circuit of the control circuit 62.

Figure 2:
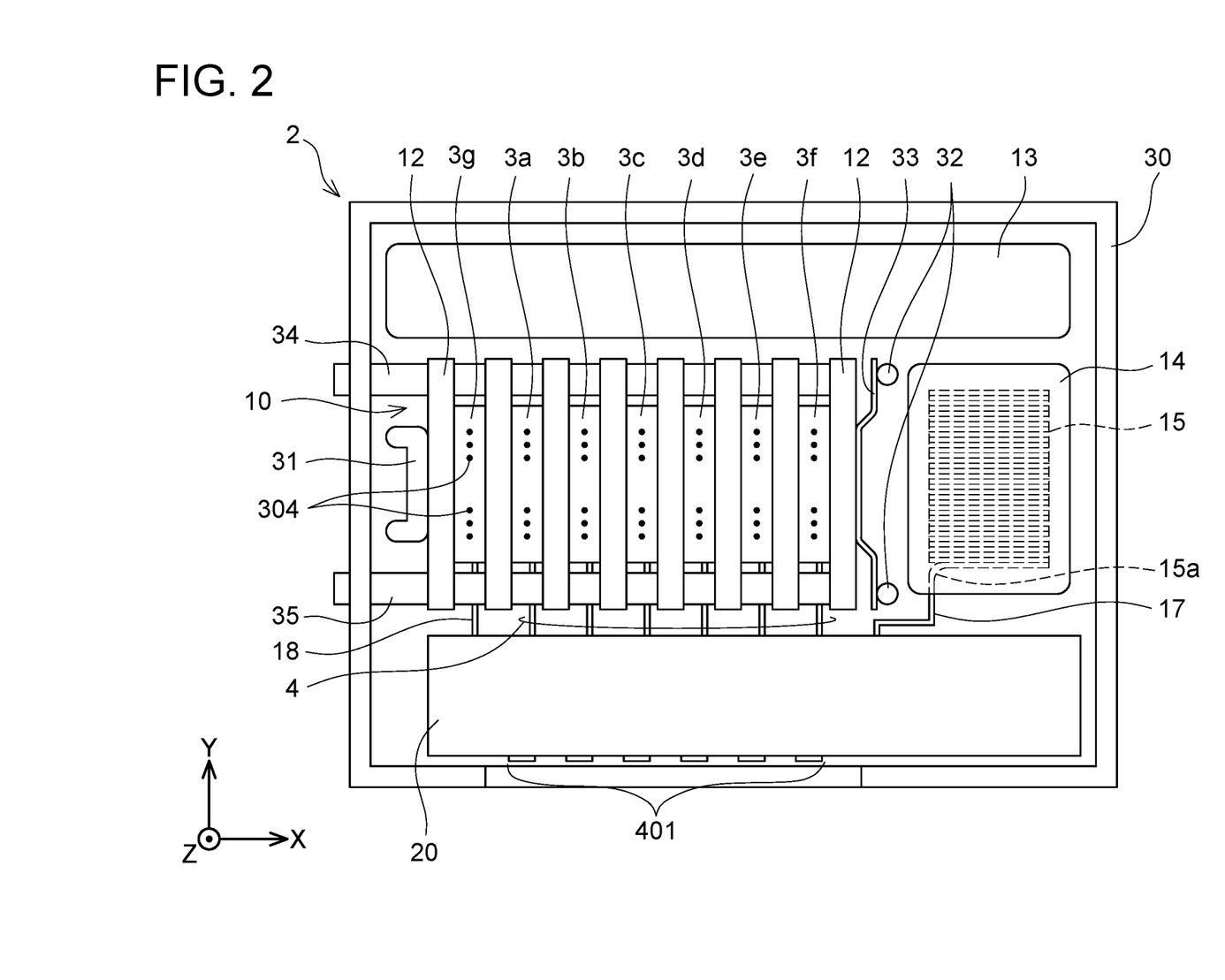
FIG. 2 is a planar view showing a component layout inside a housing of the power converter (except for a circuit board).
Figure 3:
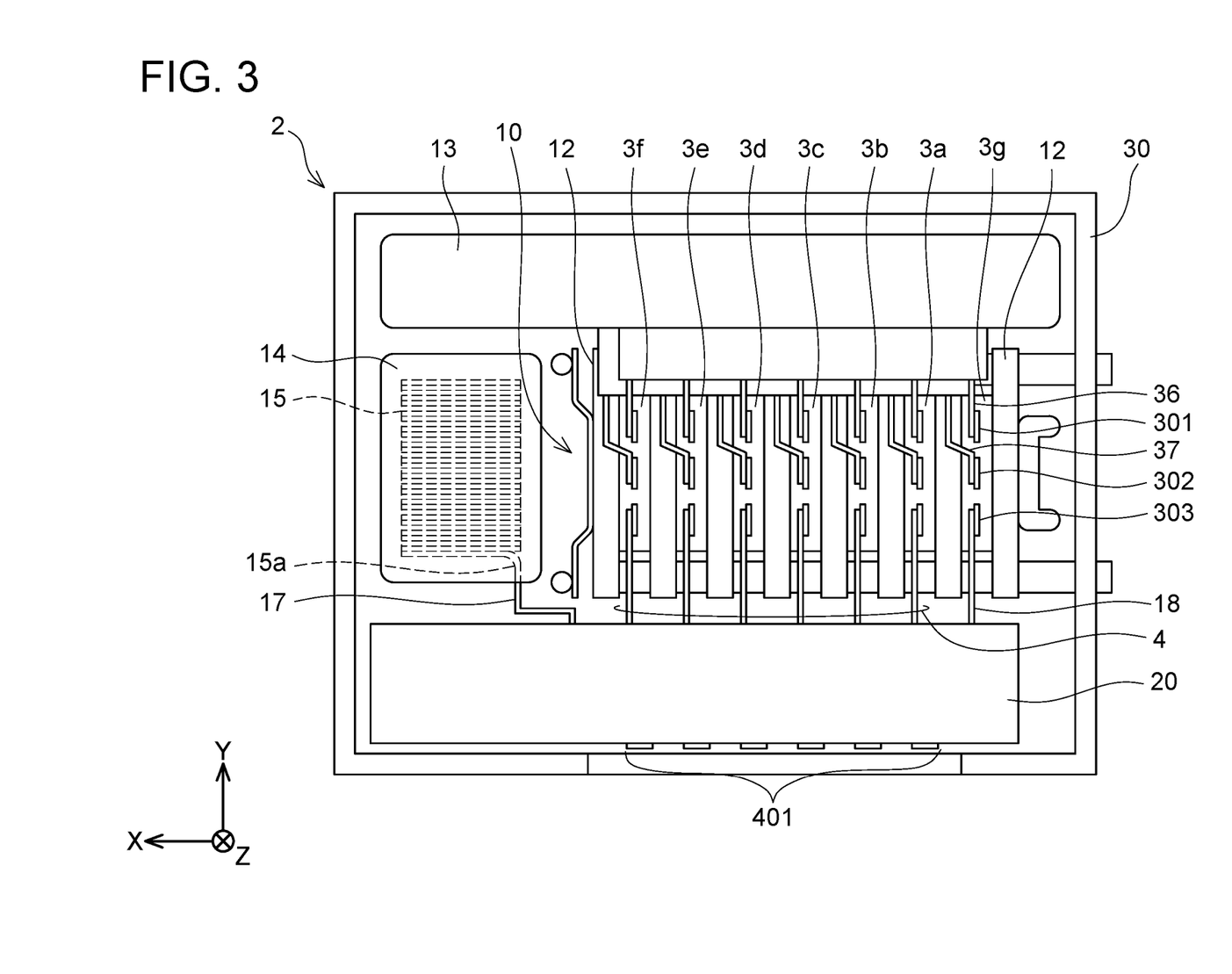
FIG. 3 is a bottom view showing the component layout inside the housing of the power converter.
Figure 4:
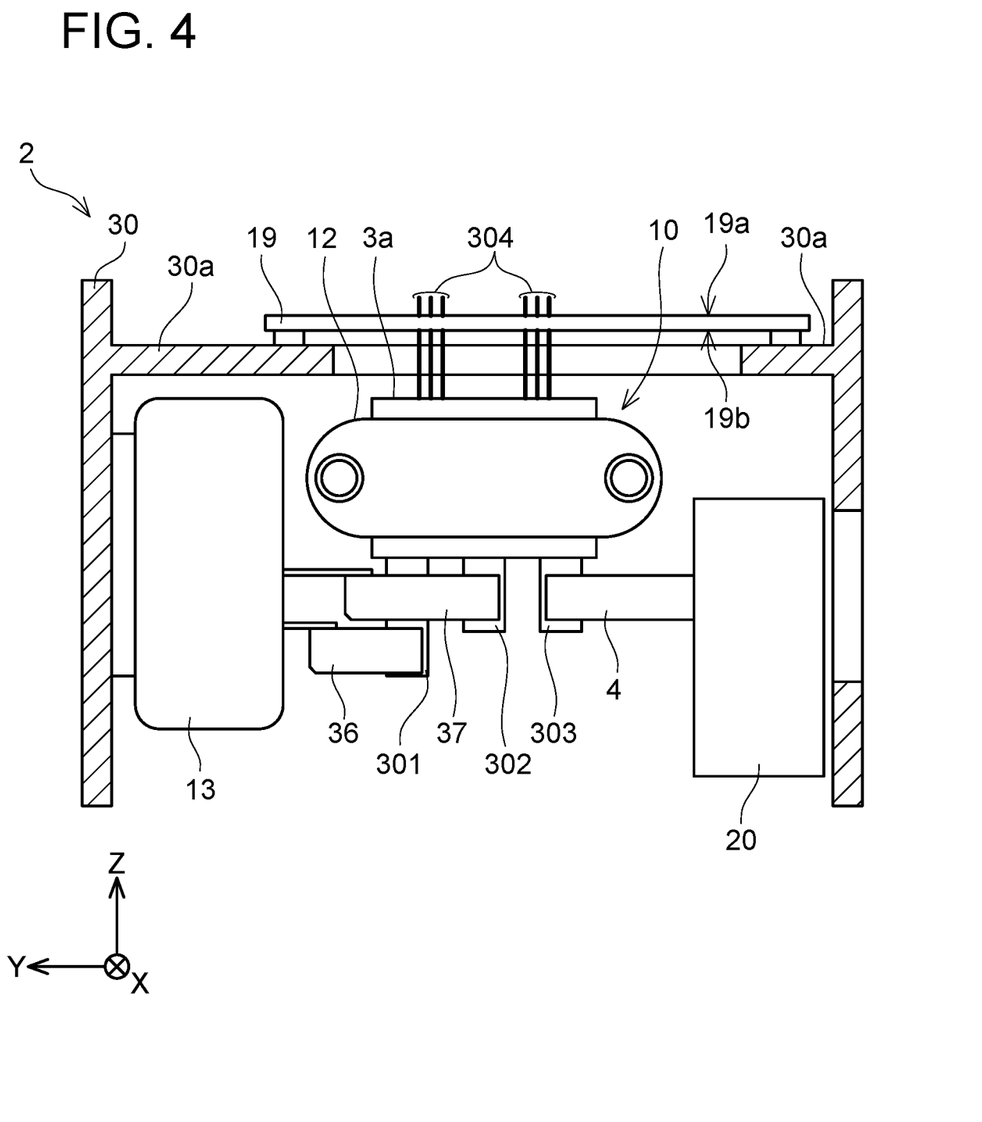
FIG. 4 is a cross-sectional view showing the component layout inside the housing of the power converter.

A hardware configuration of the power converter 2 will be described with reference to FIGS. 2 to 4. FIG. 2 is a plan view showing a component layout inside a housing 30 of the power converter 2. For the simplicity of explanation, a Z-axis positive direction in a coordinate system depicted in the drawings will be defined as "above". As will be described later, the circuit board 19 is arranged at a topmost portion in the housing 30, however, a depiction of the circuit board 19 is omitted from FIG. 2. Further, a housing partition 30a to be described later is also omitted from FIG. 2. The housing 30 has opened upper and lower sides, and components can be housed therein from above and from below. FIG. 3 is a bottom view seeing the housing 30 from below. FIG. 4 is a cross-sectional view which cut the housing 30 along a YZ plane in the coordinate system depicted in the drawing. In FIG. 4, a depiction of some of components is omitted to be easy understood.

A stacked unit 10, a capacitor unit 13, a reactor unit 14, a terminal unit 20, and the circuit board 19 are housed in the housing 30 of the power converter 2. As aforementioned, FIG. 2 omits the depiction of the circuit board 19, and the circuit board 19 is depicted only in FIG. 4. The stacked unit 10 is a device in which the plurality of semiconductor modules 3a to 3g and a plurality of coolers 12 are stacked. In FIGS. 2 and 3, a reference sign 12 is given to the coolers at both ends of the stacked unit 10, and the reference sign is omitted for other coolers. The plurality of coolers 12 is arranged in parallel, and each semiconductor module is interposed between its adjacent coolers 12. Each of the semiconductor modules has a flat shape, and the plurality of semiconductor modules 3a to 3g is arranged parallel to each other in the stacked unit 10 such that their wider width surfaces face each other. Each of the semiconductor modules 3a to 3g houses two transistors and two diodes, and the two transistors connected in series therein. Each of the diodes is connected in inverse parallel to its corresponding transistor. As aforementioned, the semiconductor modules 3a to 3c are used in the inverter circuit 43a and the semiconductor modules 3d to 3f are used in the inverter circuit 43b. The semiconductor module 3g is used in the voltage converter circuit 42. Hereinbelow, in a case of presenting one of the semiconductor modules 3a to 3g without the need to distinguish it from the others, it will be termed a semiconductor module 3.

The stacked unit 10 is interposed between an inner wall 31 and posts 32 provided in the housing 30, together with a plate spring 33. The inner wall 31 and the posts 32 extend from the housing partition 30a which is omitted in FIG. 2 and FIG. 3. The plate spring 33 presses the stacked unit 10 in a stacking direction of the plurality of semiconductor modules 3. An X direction in the coordinate system in the drawings corresponds to the stacking direction. A coolant supply pipe 34 and a coolant discharge pipe 35 penetrate the plurality of coolers 12. Coolant supplied through the coolant supply pipe 34 is distributed to the plurality of coolers 12. The coolant absorbs heat from the adjacent semiconductor modules 3 while passing through the respective coolers 12. The coolant that had absorbed the heat is discharged from the stacked unit 10 through the coolant discharge pipe 35.

A plurality of control terminals 304 extends from an upper surface of each of the semiconductor modules 3. In FIG. 2, a reference sign 304 is given to only the control terminals of one semiconductor module 3 at the left end, and the reference sign is omitted for the control terminals of other semiconductor modules 3. The control terminals 304 include control terminals connected to gate terminals of the transistors housed in the semiconductor modules 3 and control terminals of temperature sensors installed in the semiconductor modules 3. As shown in FIG. 4, the control terminals 304 pass through the circuit board 19 and are connected to circuits boarded in the circuit board 19.

As shown in FIG. 3, three power terminals (a positive terminal 301, a negative terminal 302, a midpoint terminal 303) extend from a lower surface of each semiconductor module 3. In FIG. 3, reference signs 301, 302, 303 are given to only the power terminals of the one semiconductor module 3 on the right end, and the reference signs are omitted for the power terminals of other semiconductor modules 3. The positive terminal 301, the negative terminal 302, and the midpoint terminal 303 respectively connect to the high potential side, the low potential side, and the midpoint of the series connection of the two transistors within each semiconductor module 3. The positive terminals 301 of the plurality of semiconductor modules 3 are connected to the capacitor unit 13 by positive bus bars 36, and the negative terminals 302 thereof are connected to the capacitor unit 13 by negative bus bars 37. The capacitor unit 13 seals a capacitor element corresponding to the filter capacitor 44 and a capacitor element corresponding to the smoothing capacitor 46 shown in FIG. 1. The positive terminals 301 and the negative terminals 302 of all the semiconductor modules 3 are connected to the capacitor element corresponding to the smoothing capacitor 46 via the positive bus bars 36 and the negative bus bars 37. In FIGS. 2 to 4, connection structures for the filter capacitor 44, the input terminal 48, and the output terminal 49 of FIG. 1 are omitted from depiction.

First bus bars 4 are respectively connected to the midpoint terminals 303 of the semiconductor modules 3a to 3f constituting the inverter circuits 43a, 43b of FIG. 1. The plurality of first bus bars 4 is connected to the terminal unit 20. The terminal unit 20 is a component for connecting power cables leading to the motors. The first bus bars 4 penetrate through a resin body of the terminal unit 20, and tip ends thereof are configured as connection terminals 401 for connecting the power cables.

A reactor element 15 corresponding to the reactor 45 shown in FIG. 1 is accommodated within the reactor unit 14. A main component of the reactor element 15 is a coil, and one end 15a thereof has a second bus bar 17 connected thereto. Another end of the reactor element 15 (the reactor 45 of FIG. 1) is omitted from depiction. The second bus bar 17 is also supported by the terminal unit 20. Inside the body of the terminal unit 20, the second bus bar 17 connects with a third bus bar 18 extending from the midpoint terminal of the semiconductor module 3g. As aforementioned, the semiconductor module 3g is a module used in the voltage converter circuit 42 (see FIG. 1).

As shown in FIG. 4, the housing partition 30a extends from an inner surface of the housing 30, and the circuit board 19 is fixed on the housing partition 30a. The housing partition 30a has an opening provided therein, and the control terminals 304 extending from the plurality of semiconductor modules 3a to 3g pass through the opening and are connected to the circuit board 19. As shown in FIG. 1, various circuits such as the input voltage adjustment circuit 61a, the output voltage adjustment circuit 61b, and the control circuit 62, are boarded in the circuit board 19.

Figure 5:
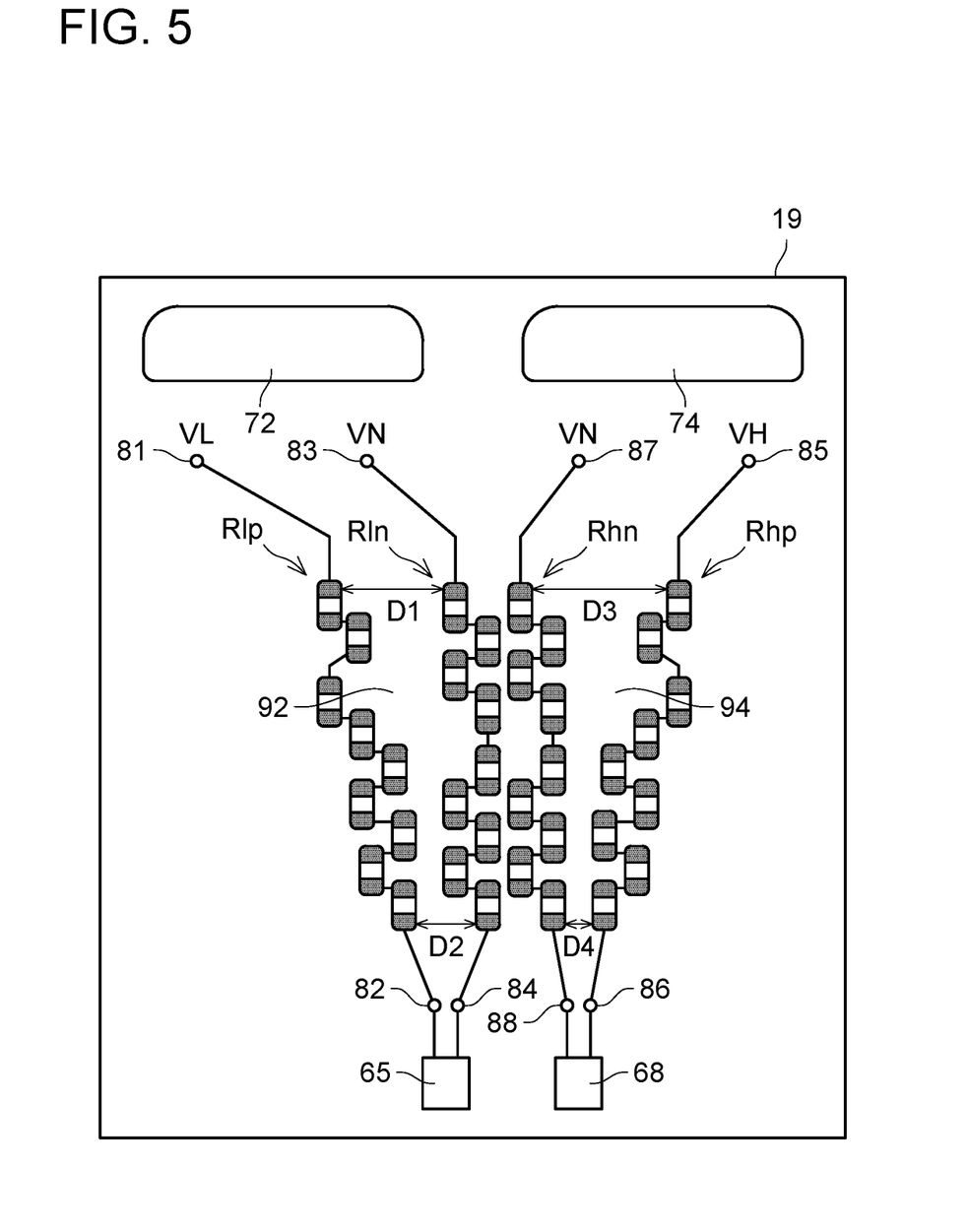
FIG. 5 is a diagram showing an example of a layout for a plurality of resistor element groups boarded in the circuit board, and corresponding to a component surface.

FIG. 5 shows an example of a layout for the resistor element groups Rlp, Rln, Rhp, Rhn boarded in the circuit board 19. FIG. 5 shows a component surface of the circuit board 19. A solder surface of the circuit board 19 corresponds to a surface with a reference sign 19b of the circuit board 19 shown in FIG. 4, and the component surface thereof corresponds to a surface with a reference sign 19a, of the circuit board 19 shown in FIG. 4.

Each of reference signs 72, 74 in the drawing represents a site to which the control terminals 304 of one of the semiconductor modules 3a to 3g constituting the inverter circuits 43a, 43b and the voltage convertor circuit 42 are connected. For example, the control terminals 304 extending from the upper switching element 9a of the semiconductor module 3g are inserted in the connection region 72 and connected thereto, and the control terminals 304 extending from the lower switching element 9b of the semiconductor module 3g are inserted in the connection region 74 and connected thereto. Although the circuit board 19 is provided with such connection regions respectively corresponding to the plurality of semiconductor modules 3a to 3g, FIG. 5 only shows the connection regions for one of the semiconductor modules.

As shown in FIG. 5, each of the resistor element groups Rlp, Rln, Rhp. Rhn is boarded in the component surface of the circuit board 19. Furthermore, the second resistor element group Rln and the fourth resistor element group Rhn are arranged between the first resistor element group Rlp and the third resistor element group Rhp, and are arranged to be adjacent to each other in the circuit board 19. As an alternative to this example, all of the resistor element groups Rlp, Rln, Rhp, Rhn may be boarded in the solder surface of the circuit board 19.

An insulating region 92 is provided between the first resistor element group Rlp and the second resistor element group Rln. Additionally, an insulating region 94 is provided between the third resistor element group Rhp and the fourth resistor element group Rhn. The insulating regions 92, 94 are regions where necessary creeping distances are ensured to prevent electrical breakdown in a region where a potential difference occurs and no circuit elements such as wiring and an element are provided. On the other hand, such an insulating region is not substantially provided between the second resistor element group Rln and the fourth resistor element group Rhn. Specifically, a boarding area defined by an outer perimeter of the plurality of resistor elements belonging to the second resistor element group Rln is adjacent to a boarding area defined by an outer perimeter of the plurality of resistor elements belonging to the fourth resistor element group Rhn, and no insulating region is substantially provided between these ranges. In other words, the insulating region 92 between a boarding area of the first resistor element group Rlp and the boarding area of the second resistor element group Rln has an area larger than an area between the boarding area of the second resistor element group Rln and the boarding area of the fourth resistor element group Rhn, and the insulating region 94 between a boarding area of the third resistor element group Rhp and the boarding area of the fourth resistor element group Rhn also has an area larger than the area between the boarding area of the second resistor element group Rln and the boarding area of the fourth resistor element group Rhn.

A terminal with a reference sign 81 is connected to the input positive terminal 48a, and a terminal with a reference sign 82 is connected to the inverting input terminal of the operational amplifier OP1 of the first differential amplifier circuit 65. A terminal with a reference sign 83 is connected to the input negative terminal 48b, and a terminal with a reference sign 84 is connected to the non-inverting input terminal of the operational amplifier OP1 of the first differential amplifier circuit 65. A terminal with a reference sign 85 is connected to the output positive terminal 49a, and a terminal with a reference sign 86 is connected to the inverting input terminal of the operational amplifier OP2 of the second differential amplifier circuit 68. A terminal with a reference sign 87 is connected to the input negative terminal 48b (that is, the output negative terminal 49b), and a terminal with a reference sign 88 is connected to the non-inverting input terminal of the operational amplifier OP2 of the second differential amplifier circuit 68.

The negative voltage VN is inputted to both of the second resistor element group Rln and the fourth resistor element group Rhn, that is, the same voltage is applied to both of them. Due to this, there is no need to ensure a creeping distance between the second resistor element group Rln and the fourth resistor element group Rhn. The second resistor element group Rln and the fourth resistor element group Rhn can thereby be arranged to be adjacent to each other in the circuit board 19. Consequently, the resistor element groups Rlp, Rln, Rhp, Rhn can be boarded in the circuit board 19 with a small footprint.

A large voltage difference exists between the resistor element that is at an electrically nearest side to the terminal 81 among the plurality of resistor elements belonging to the first resistor element group Rlp and the resistor element that is at an electrically nearest side to the terminal 83 among the plurality of resistor elements belonging to the second resistor element group Rln, so a distance D1 therebetween is set to be large. On the other hand, a small voltage difference exists between the resistor element that is at an electrically nearest side to the terminal 82 among the plurality of resistor elements belonging to the first resistor element group Rlp and the resistor element that is at an electrically nearest side to the terminal 84 among the plurality of resistor elements belonging to the second resistor element group Rln, so a distance D2 therebetween is set to be small. As such, a layout where the first resistor element group Rlp and the second resistor element group Rln satisfy a relation of D1>D2 can contribute to reduction in an area of the circuit board 19.

Similarly, a large voltage difference exists between the resistor element that is at an electrically nearest side to the terminal 85 among the plurality of resistor elements belonging to the third resistor element group Rhp and the resistor element that is at an electrically nearest side to the terminal 87 among the plurality of resistor elements that belongs to the fourth resistor element group Rhn, so a distance D3 therebetween is set to be large. On the other hand, a small voltage difference exists between the resistor element that is at an electrically nearest side to the terminal 86 among the plurality of resistor elements belonging to the third resistor element group Rhp and the resistor element that is at an electrically nearest side to the terminal 88 among the plurality of resistor elements belonging to the fourth resistor element group Rhn, so a distance D4 therebetween is set to be small. As such, a layout where the third resistor element group Rhp and the fourth resistor element group Rhn satisfy a relation D3>D4 can contribute to reduction in the area of the circuit board 19.

The drive circuits for driving the switching elements of the semiconductor modules are also boarded in the circuit board 19. Each of such drive circuits executes a switching operation at high speed, and hence emits noise. Therefore, to suppress an influence of such emitted noise, the resistor element groups Rlp, Rln, Rhp, Rhn, each of which has a high impedance, are preferably boarded at positions apart from the drive circuits. As described above, since the resistor element groups Rlp, Rln, Rhp, Rhn can be boarded in the circuit board 19 with a small footprint, restrictions imposed on their layout in the circuit board 19 are eased. The resistor element groups Rlp. Rln, Rhp, Rhn can therefore be boarded in the circuit board 19 at positions less subjected to emitted noise.

Figure 6:
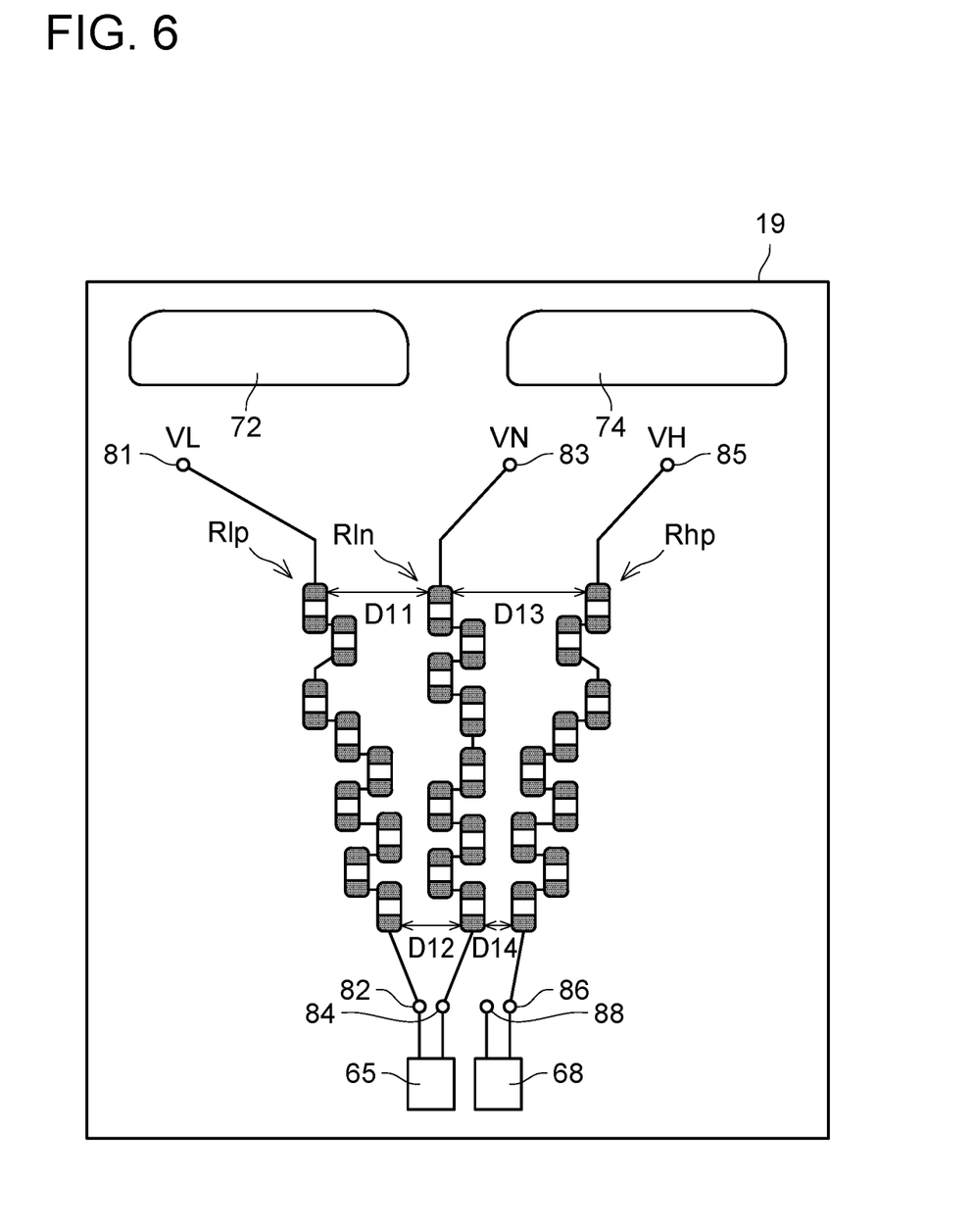
FIG. 6 is a diagram showing another example of a layout for the plurality of resistor element groups boarded in the circuit board, and corresponding to the component surface.
Figure 7:
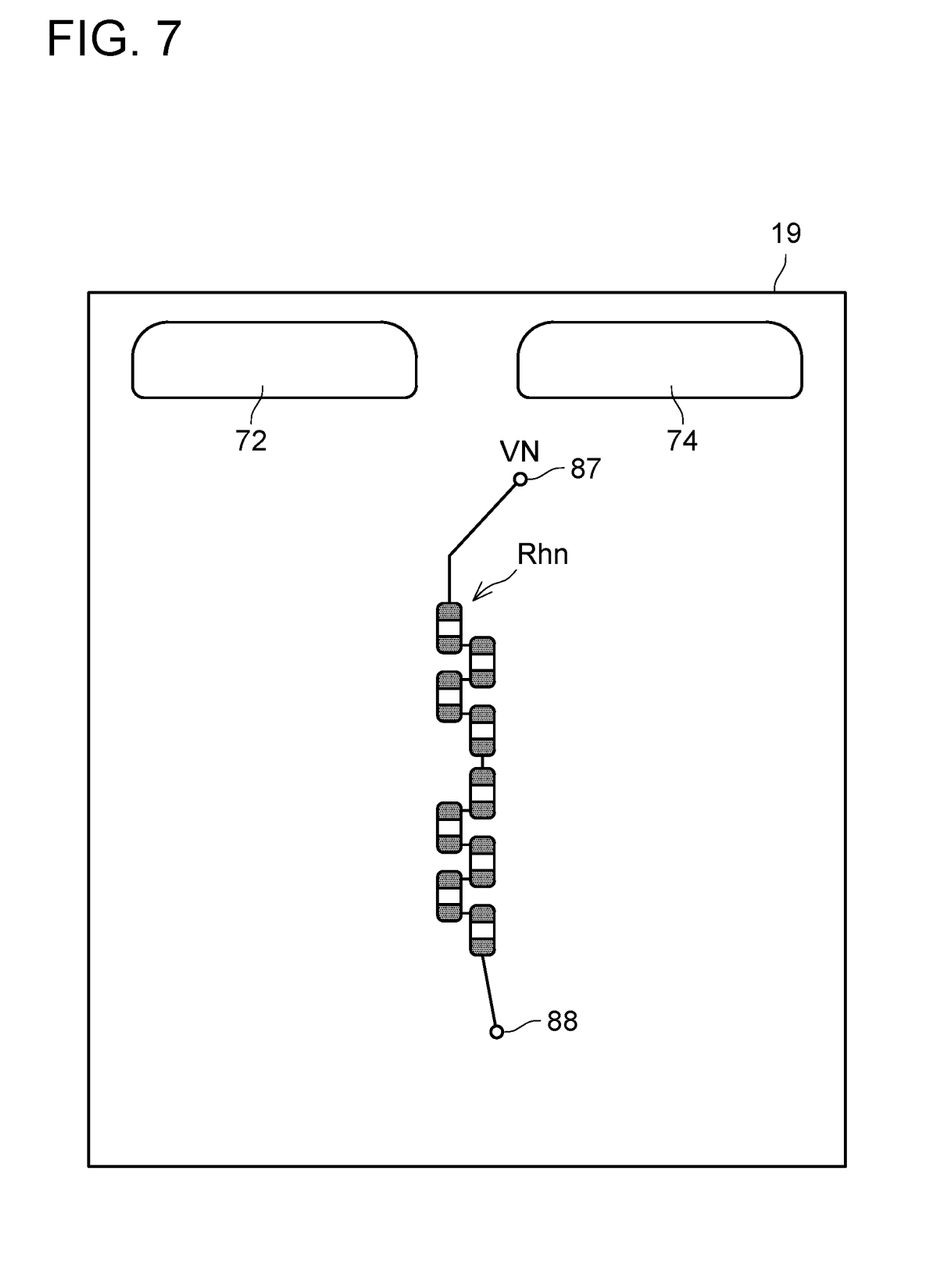
FIG. 7 is a diagram showing the other example of the layout for the plurality of resistor element groups boarded in the circuit board, and corresponding to a solder surface.

FIG. 6 and FIG. 7 show another example of a layout for the resistor element groups Rlp, Rln, Rhp, Rhn boarded in the circuit board 19. FIG. 6 shows the component surface of the circuit board 19, and FIG. 7 shows the solder surface of the circuit board 19.

As shown in FIG. 6, the first resistor element group Rlp, the second resistor element group Rln, and the third resistor element group Rhp are boarded in the component surface of the circuit board 19. As shown in FIG. 7, the fourth resistor element group Rhn is boarded in the solder surface of the circuit board 19. As such, the second resistor element group Rln and the fourth resistor element group Rhn are separately boarded in the component surface and the solder surface of the circuit board 19, respectively. As an alternative to this example, the second resistor element group Rln may be boarded in the solder surface, and the fourth resistor element group Rhn may be boarded in the component surface.

The terminal 83 (see FIG. 6) connected to the second resistor element group Rln and the terminal 87 (FIG. 7) connected to the fourth resistor element group Rhn are connected via a conductor which is provided to penetrate the solder surface and the component surface. The terminal 88 (FIGS. 6, 7) connected to the fourth resistor element group Rhn is seen in both of the solder surface and the component surface due to a conductor provided to penetrate the solder surface and the component surface.

In a planar view of the circuit board 19, at least a part of the boarding area of the plurality of resistor elements belonging to the second resistor element group Rln and at least a part of the boarding area of the plurality of resistor elements belonging to the fourth resistor element group Rhn are arranged to overlap each other. Here, "in a planar view of the circuit board 19" means "in a view along a direction orthogonal to the solder surface and the component surface of the circuit board 19". The negative voltage VN is inputted to both of the second resistor element group Rln and the fourth resistor element group Rhn, so the same voltage is applied to both of them (see FIG. 1). Therefore, even when the second resistor element group Rln and the fourth resistor element group Rhn are separately arranged in front and back surfaces of the circuit board 19, electrical breakdown of the circuit board 19 can be suppressed between the second resistor element group Rln and the fourth resistor element group Rhn. As such, the second resistor element group Rln and the fourth resistor element group Rhn can be arranged to be adjacent to each other respectively in the front and back surfaces of the circuit board 19, so the resistor element groups Rlp, Rln, Rhp, Rhn can be boarded in the circuit board 19 with a small footprint.

As shown in FIG. 6, a large voltage difference exists between the resistor element that is at the electrically nearest side to the terminal 81 among the plurality of resistor elements belonging to the first resistor element group Rlp and the resistor element that is at the electrically nearest side to the terminal 83 among the plurality of resistor elements belonging to the second resistor element group Rln, so a distance D11 therebetween is set to be large. On the other hand, a small voltage difference exists between the resistor element that is at the electrically nearest side to the terminal 82 among the plurality of resistor elements belonging to the first resistor element group Rlp and the resistor element that is at the electrically nearest side to the terminal 84 among the plurality of resistor elements belonging to the second resistor element group Rln, so a distance D2 therebetween is set to be small. As such, a layout where the first resistor element group Rlp and the second resistor element group Rln satisfy a relation D11>D12 can contribute to reduction in the area of the circuit board 19.

Similarly, a large voltage difference exists between the resistor element that is at the electrically nearest side to the terminal 85 among the plurality of resistor elements belonging to the third resistor element group Rhp and the resistor element that is at the electrically nearest side to the terminal 83 among the plurality of resistor elements belonging to the second resistor element group Rln, so a distance D13 therebetween is set to be large. On the other hand, a small voltage difference exists between the resistor element that is at the electrically nearest side to the terminal 86 among the plurality of resistor elements belonging to the third resistor element group Rhp and the resistor element that is at the electrically nearest side to the terminal 84 among the plurality of resistor elements belonging to the second resistor element group Rln, so a distance D14 therebetween is set to be small. As such, a layout where the third resistor element group Rhp and the second resistor element group Rln satisfy a relation D13>D14 can contribute to reduction in the area of the circuit board 19.

Some of the features characteristic to the above-described embodiment will herein be listed. It should be noted that the respective technical elements are independent of one another, and are useful solely or in combinations. The combinations thereof are not limited to those described in the claims as originally filed.

A circuit board comprises a circuit configured to measure both of an input voltage and an output voltage in a voltage converter that is configured to convert the input voltage which is a difference between a first voltage and a second voltage into the output voltage which is a difference between a third voltage and the second voltage. This circuit board may comprise: a first resistor circuit comprising a first resistor element group; a second resistor circuit comprising a second resistor element group; a third resistor circuit comprising a third resistor element group; a fourth resistor circuit comprising a fourth resistor element group; a first differential amplifier circuit comprising a pair of input terminals, and is configured such that the first voltage is inputted to one of the pair of input terminals via the first resistor element group of the first resistor circuit and the second voltage is inputted to other one of the pair of input terminals via the second resistor element group of the second resistor circuit; a second differential amplifier circuit comprising a pair of input terminals, and is configured such that the third voltage is inputted to one of the pair of input terminals via the third resistor element group of the third resistor circuit and the second voltage is inputted to other one of the pair of input terminals via the fourth resistor element group of the fourth resistor circuit; and a control circuit comprising an A/D conversion circuit configured to execute A/D conversion for each of an output from the first differential amplifier circuit and an output from the second differential amplifier circuit. The second resistor element group and the fourth resistor element group may arranged to be adjacent to each other between the first resistor element group and the third resistor element group.

In an embodiment of the above control circuit, the second resistor element group and the fourth resistor element group may be located on a same surface of the circuit board.

In one embodiment of the above control circuit, the second resistor element group and the fourth resistor element group may be located on a surface of the circuit board where the first resistor element group and the third resistor element group are located. In this case, a first distance is a distance between a resistor element which is connected at a nearest side to the voltage converter among a plurality of resistor elements belonging to the first resistor element group and a resistor element which is connected at the nearest side to the voltage converter among a plurality of resistor elements belonging to the second resistor element group, a second distance is a distance between a resistor element which is connected at a nearest side to the first differential amplifier circuit among the plurality of resistor elements belonging to the first resistor element group and a resistor element which is connected at the nearest side to the first differential amplifier circuit among the plurality of resistor elements belonging to the second resistor element group, and the first distance may be larger than the second distance. Further, a third distance is a distance between a resistor element which is connected at the nearest side to the voltage converter among a plurality of resistor elements belonging to the third resistor element group and a resistor element which is connected at the nearest side to the voltage converter among a plurality of resistor elements belonging to the fourth resistor element group, a fourth distance is a distance between a resistor element which is connected at a nearest side to the second differential amplifier circuit among the plurality of resistor elements belonging to the third resistor element group and a resistor element which is connected at the nearest side to the second differential amplifier circuit among the plurality of resistor elements belonging to the fourth resistor element group, and the third distance may be larger than the fourth distance.

In one embodiment of the above control circuit, the second resistor element group may be located on one of surfaces of the circuit board and the fourth resistor element group may be located on another one of the surfaces of the circuit board. In this case, in a planar view of the circuit board, at least a part of a boarding area of a plurality of resistor elements belonging to the second resistor element group and at least a part of a boarding area of a plurality of resistor elements belonging to the fourth resistor element group may be arranged to overlap each other.

In one embodiment of the above control circuit, the second resistor element group may be located on a surface of the circuit board where the first resistor element group and the third resistor element group are located. In this case, a first distance is a distance between a resistor element which is connected at a nearest side to the voltage converter among a plurality of resistor elements belonging to the first resistor element group and a resistor element which is connected at a nearest side to the voltage converter among the plurality of resistor elements belonging to the second resistor element group, a second distance is a distance between a resistor element which is connected at a nearest side to the first differential amplifier circuit among the plurality of resistor elements belonging to the first resistor element group and a resistor element which is connected at a nearest side to the first differential amplifier circuit among the plurality of resistor elements belonging to the second resistor element group, and the first distance may be larger than the second distance. Further, a third distance is a distance between a resistor element which is connected at a nearest side to the voltage converter among a plurality of resistor elements belonging to the third resistor element group and the resistor element which is connected at the nearest side to the voltage converter among the plurality of resistor elements belonging to the second resistor element group, a fourth distance is a distance between a resistor element which is connected at a nearest side to the second differential amplifier circuit among the plurality of resistor elements belonging to the third resistor element group and the resistor element which is connected at the nearest side to the first differential amplifier circuit among the plurality of resistor elements belonging to the second resistor element group, and the third distance may be larger than the fourth distance.

In one embodiment of the above control circuit, the fourth resistor element group may be located on a surface of the circuit board where the first resistor element group and the third resistor element group are located. In this case, a first distance is a distance between a resistor element which is connected at a nearest side to the voltage converter among a plurality of resistor elements belonging to the first resistor element group and a resistor element which is connected at a nearest side to the voltage converter among the plurality of resistor elements belonging to the fourth resistor element group, a second distance is a distance between a resistor element which is connected at a nearest side to the first differential amplifier circuit among the plurality of resistor elements belonging to the first resistor element group and a resistor element which is connected at a nearest side to the second differential amplifier circuit among the plurality of resistor elements belonging to the fourth resistor element group, and the first distance may be larger than the second distance. Further, a third distance is a distance between a resistor element which is connected at a nearest side to the voltage converter among a plurality of resistor elements belonging to the third resistor element group and the resistor element which is connected at the nearest side to the voltage converter among the plurality of resistor elements belonging to the fourth resistor element group, a fourth distance is a distance between a resistor element which is connected at a nearest side to the second differential amplifier circuit among the plurality of resistor elements belonging to the third resistor element group and a resistor element which is connected at the nearest side to the second differential amplifier circuit among the plurality of resistor elements belonging to the fourth resistor element group, and the third distance may be larger than the fourth distance.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A circuit board comprising a circuit configured to measure both of an input voltage and an output voltage in a voltage converter that is configured to convert the input voltage which is a difference between a first voltage and a second voltage into the output voltage which is a difference between a third voltage and the second voltage, the circuit board comprising:
   a first resistor circuit comprising a first resistor element group;
   a second resistor circuit comprising a second resistor element group;
   a third resistor circuit comprising a third resistor element group;
   a fourth resistor circuit comprising a fourth resistor element group;
   a first differential amplifier circuit comprising a pair of input terminals, and configured such that the first voltage is inputted to one of the pair of input terminals via the first resistor element group of the first resistor circuit and the second voltage is inputted to other one of the pair of input terminals via the second resistor element group of the second resistor circuit;

a second differential amplifier circuit comprising a pair of input terminals, and configured such that the third voltage is inputted to one of the pair of input terminals via the third resistor element group of the third resistor circuit and the second voltage is inputted to other one of the pair of input terminals via the fourth resistor element group of the fourth resistor circuit; and a control circuit comprising an A/D conversion circuit configured to execute A/D conversion for each of an output from the first differential amplifier circuit and an output from the second differential amplifier circuit, wherein:

the second resistor element group and the fourth resistor element group are arranged to be adjacent to each other between the first resistor element group and the third resistor element group, the second resistor element group and the fourth resistor element group are located on a same surface of the circuit board, the second resistor element group and the fourth resistor element group are located on a surface of the circuit board where the first resistor element group and the third resistor element group are located, a first distance is a distance between a resistor element which is connected at a nearest side to the voltage converter among a plurality of resistor elements belonging to the first resistor element group and a resistor element which is connected at the nearest side to the voltage converter among a plurality of resistor elements belonging to the second resistor element group, a second distance is a distance between a resistor element which is connected at a nearest side to the first differential amplifier circuit among the plurality of resistor elements belonging to the first resistor element group and a resistor element which is connected at the nearest side to the first differential amplifier circuit among the plurality of resistor elements belonging to the second resistor element group, and the first distance is larger than the second distance, and a third distance is a distance between a resistor element which is connected at the nearest side to the voltage converter among a plurality of resistor elements belonging to the third resistor element group and a resistor element which is connected at the nearest side to the voltage converter among a plurality of resistor elements belonging to the fourth resistor element group, a fourth distance is a distance between a resistor element which is connected at a nearest side to the second differential amplifier circuit among the plurality of resistor elements belonging to the third resistor element group and a resistor element which is connected at the nearest side to the second differential amplifier circuit among the plurality of resistor elements belonging to the fourth resistor element group, and the third distance is larger than the fourth distance.

2. A circuit board comprising a circuit configured to measure both of an input voltage and an output voltage in a voltage converter that is configured to convert the input voltage which is a difference between a first voltage and a second voltage into the output voltage which is a difference between a third voltage and the second voltage, the circuit board comprising:

a first resistor circuit comprising a first resistor element group;

a second resistor circuit comprising a second resistor element group;

a third resistor circuit comprising a third resistor element group;

a fourth resistor circuit comprising a fourth resistor element group;

a first differential amplifier circuit comprising a pair of input terminals, and configured such that the first voltage is inputted to one of the pair of input terminals via the first resistor element group of the first resistor circuit and the second voltage is inputted to other one of the pair of input terminals via the second resistor element group of the second resistor circuit;

a second differential amplifier circuit comprising a pair of input terminals, and configured such that the third voltage is inputted to one of the pair of input terminals via the third resistor element group of the third resistor circuit and the second voltage is inputted to other one of the pair of input terminals via the fourth resistor element group of the fourth resistor circuit; and a control circuit comprising an A/D conversion circuit configured to execute A/D conversion for each of an output from the first differential amplifier circuit and an output from the second differential amplifier circuit, wherein:

the second resistor element group and the fourth resistor element group are arranged to be adjacent to each other between the first resistor element group and the third resistor element group, the second resistor element group is located on one of surfaces of the circuit board and the fourth resistor element group is located on another one of the surfaces of the circuit board, in a planar view of the circuit board, at least a part of a boarding area of a plurality of resistor elements belonging to the second resistor element group and at least a part of a boarding area of a plurality of resistor elements belonging to the fourth resistor element group are arranged to overlap each other, the second resistor element group is located on a surface of the circuit board where the first resistor element group and the third resistor element group are located, a first distance is a distance between a resistor element which is connected at a nearest side to the voltage converter among a plurality of resistor elements belonging to the first resistor element group and a resistor element which is connected at a nearest side to the voltage converter among the plurality of resistor elements belonging to the second resistor element group, a second distance is a distance between a resistor element which is connected at a nearest side to the first differential amplifier circuit among the plurality of resistor elements belonging to the first resistor element group and a resistor element which is connected at a nearest side to the first differential amplifier circuit among the plurality of resistor elements belonging to the second resistor element group, and the first distance is larger than the second distance, and a third distance is a distance between a resistor element which is connected at a nearest side to the voltage converter among a plurality of resistor elements belonging to the third resistor element group and the resistor element which is connected at the nearest side to the voltage converter among the plurality of resistor elements belonging to the second resistor element group, a fourth distance is a distance between a resistor element which is connected at a nearest side to the second differential amplifier circuit among the plurality of resistor elements belonging to the third resistor element group and the resistor element which is connected at the nearest side to the first differential amplifier circuit among the plurality of resistor elements belonging to the second resistor element group, and the third distance is larger than the fourth distance.

3. A circuit board comprising a circuit configured to measure both of an input voltage and an output voltage in a voltage converter that is configured to convert the input voltage which is a difference between a first voltage and a second voltage into the output voltage which is a difference between a third voltage and the second voltage, the circuit board comprising:
- a first resistor circuit comprising a first resistor element group;
- a second resistor circuit comprising a second resistor element group;
- a third resistor circuit comprising a third resistor element group;
- a fourth resistor circuit comprising a fourth resistor element group;
- a first differential amplifier circuit comprising a pair of input terminals, and configured such that the first voltage is inputted to one of the pair of input terminals via the first resistor element group of the first resistor circuit and the second voltage is inputted to other one of the pair of input terminals via the second resistor element group of the second resistor circuit;
- a second differential amplifier circuit comprising a pair of input terminals, and configured such that the third voltage is inputted to one of the pair of input terminals via the third resistor element group of the third resistor circuit and the second voltage is inputted to other one of the pair of input terminals via the fourth resistor element group of the fourth resistor circuit; and
- a control circuit comprising an A/D conversion circuit configured to execute A/D conversion for each of an output from the first differential amplifier circuit and an output from the second differential amplifier circuit, wherein:
the second resistor element group and the fourth resistor element group are arranged to be adjacent to each other between the first resistor element group and the third resistor element group, the second resistor element group is located on one of surfaces of the circuit board and the fourth resistor element group is located on another one of the surfaces of the circuit board, in a planar view of the circuit board, at least a part of a boarding area of a plurality of resistor elements belonging to the second resistor element group and at least a part of a boarding area of a plurality of resistor elements belonging to the fourth resistor element group are arranged to overlap each other, the fourth resistor element group is located on a surface of the circuit board where the first resistor element group and the third resistor element group are located, a first distance is a distance between a resistor element which is connected at a nearest side to the voltage converter among a plurality of resistor elements belonging to the first resistor element group and a resistor element which is connected at a nearest side to the voltage converter among the plurality of resistor elements belonging to the fourth resistor element group, a second distance is a distance between a resistor element which is connected at a nearest side to the first differential amplifier circuit among the plurality of resistor elements belonging to the first resistor element group and a resistor element which is connected at a nearest side to the second differential amplifier circuit among the plurality of resistor elements belonging to the fourth resistor element group, and the first distance is larger than the second distance, and a third distance is a distance between a resistor element which is connected at a nearest side to the voltage converter among a plurality of resistor elements belonging to the third resistor element group and the resistor element which is connected at the nearest side to the voltage converter among the plurality of resistor elements belonging to the fourth resistor element group, a fourth distance is a distance between a resistor element which is connected at a nearest side to the second differential amplifier circuit among the plurality of resistor elements belonging to the third resistor element group and a resistor element which is connected at the nearest side to the second differential amplifier circuit among the plurality of resistor elements belonging to the fourth resistor element group, and the third distance is larger than the fourth distance.

* * * * *